United States Patent
Sato

(10) Patent No.: US 11,979,164 B2
(45) Date of Patent: May 7, 2024

(54) SEMICONDUCTOR INTEGRATED CIRCUIT, METHOD OF CONTROLLING SEMICONDUCTOR INTEGRATED CIRCUIT, AND CIRCUIT SYSTEM

(71) Applicant: Kioxia Corporation, Tokyo (JP)

(72) Inventor: Kiyohito Sato, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/175,456

(22) Filed: Feb. 27, 2023

(65) Prior Publication Data

US 2024/0097687 A1 Mar. 21, 2024

(30) Foreign Application Priority Data

Sep. 15, 2022 (JP) .................................. 2022-147172

(51) Int. Cl.
*H03L 7/099* (2006.01)
(52) U.S. Cl.
CPC .................................. *H03L 7/099* (2013.01)
(58) Field of Classification Search
CPC ..................................................... H03L 7/099
USPC ....... 331/16, 34, 18; 375/375, 359; 455/120, 455/68
See application file for complete search history.

(56) References Cited

U.S. PATENT DOCUMENTS

| | | | |
|---|---|---|---|
| 8,467,758 B2 * | 6/2013 | Sai | H03L 7/101 331/34 |
| 2008/0111597 A1 | 5/2008 | Cranford et al. | |
| 2011/0171913 A1 * | 7/2011 | Bauer | H03L 7/113 331/34 |
| 2012/0133444 A1 * | 5/2012 | Tzeng | H03L 7/22 331/34 |

FOREIGN PATENT DOCUMENTS

| | | |
|---|---|---|
| JP | 2010-509817 A | 3/2010 |
| JP | 2013-046248 A | 3/2013 |
| JP | 2018-182525 A | 11/2018 |

* cited by examiner

*Primary Examiner* — Arnold M Kinkead
(74) *Attorney, Agent, or Firm* — Kim & Stewart LLP

(57) ABSTRACT

In a semiconductor integrated circuit, a first oscillation circuit receives a first clock signal and outputs a second clock signal synchronized with the first clock signal in frequency and phase. A second oscillation circuit receives a control signal and outputs a third clock signal having a frequency corresponding to the received control signal. A detection circuit detects a frequency difference between the second clock signal and the third clock signal. A determination circuit determines whether a frequency locked state is established between the first clock signal and the second clock signal. A control circuit varies the control signal, such that the frequency difference decreases while the frequency locked state has not been established and increases after the frequency locked state is established.

20 Claims, 5 Drawing Sheets

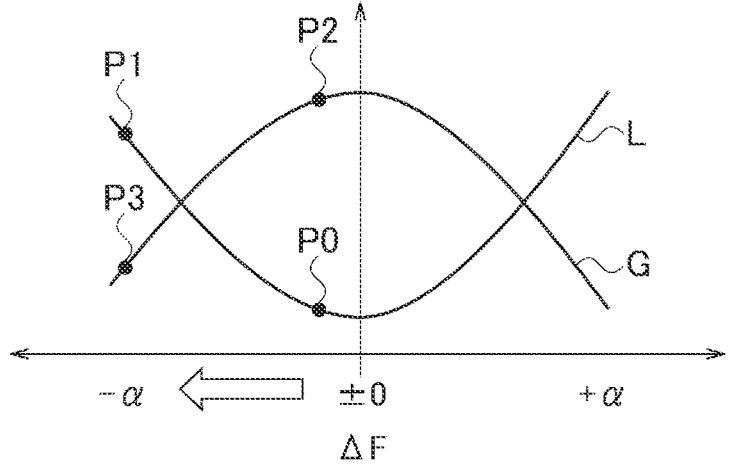
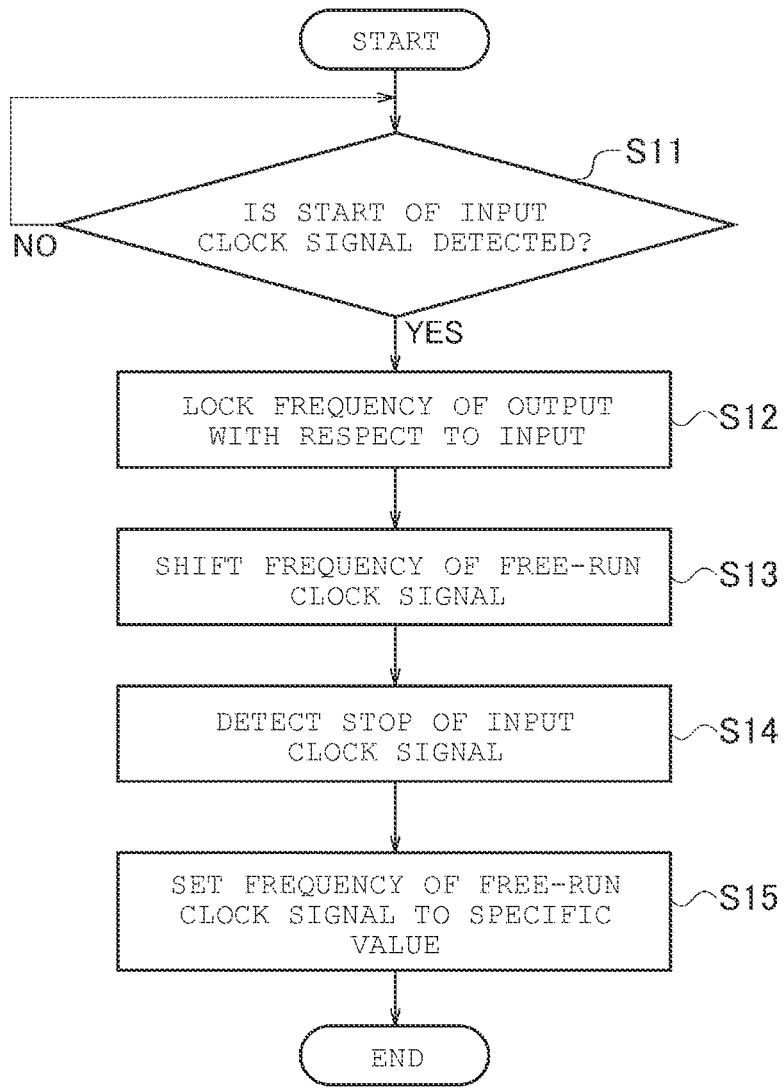

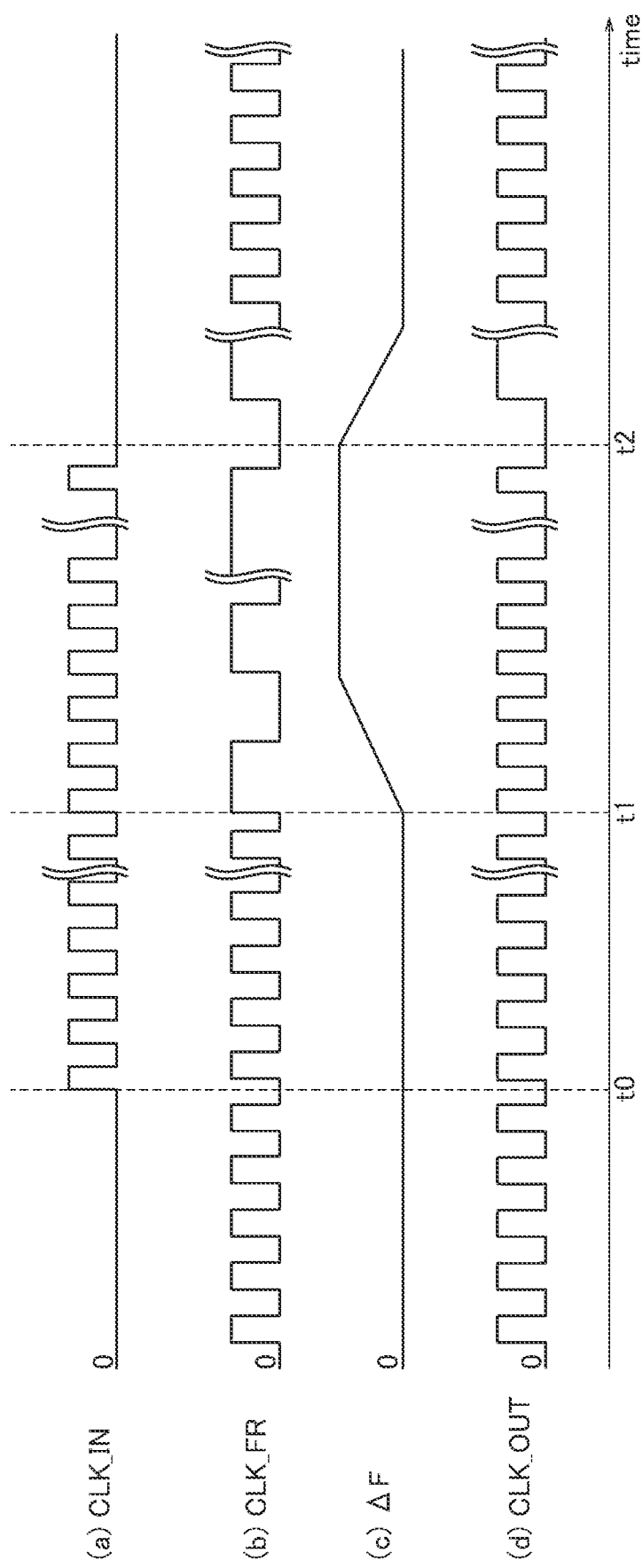

SEMICONDUCTOR INTEGRATED CIRCUIT, METHOD OF CONTROLLING SEMICONDUCTOR INTEGRATED CIRCUIT, AND CIRCUIT SYSTEM

CROSS-REFERENCE TO RELATED APPLICATION(S)

This application is based upon and claims the benefit of priority from Japanese Patent Application No. 2022-147172, filed Sep. 15, 2022, the entire contents of which are incorporated herein by reference.

FIELD

Embodiments described herein relate generally to a semiconductor integrated circuit, a method of controlling a semiconductor integrated circuit, and a circuit system.

BACKGROUND

A phase locked loop (PLL) to synchronize a phase of an input reference signal and a phase of an output signal is known. In a phase locked loop (PLL), when followability to the phase of the input reference signal is enhanced in order to lock the phase synchronization at high speed, followability to jitter of the input reference signal is also enhanced. As a result, more jitter in the input reference signal is propagated to the output signal.

BRIEF DESCRIPTION OF THE DRAWINGS

FIG. 2 is a conceptual diagram illustrating a relationship between lock time and jitter propagation susceptibility with respect to a frequency difference.

FIG. 3 is a flowchart illustrating an example of a method of controlling the semiconductor integrated circuit according to the embodiment.

FIG. 4 is a timing chart illustrating a waveform of signals in the semiconductor integrated circuit according to the embodiment.

DETAILED DESCRIPTION

Figure 1:
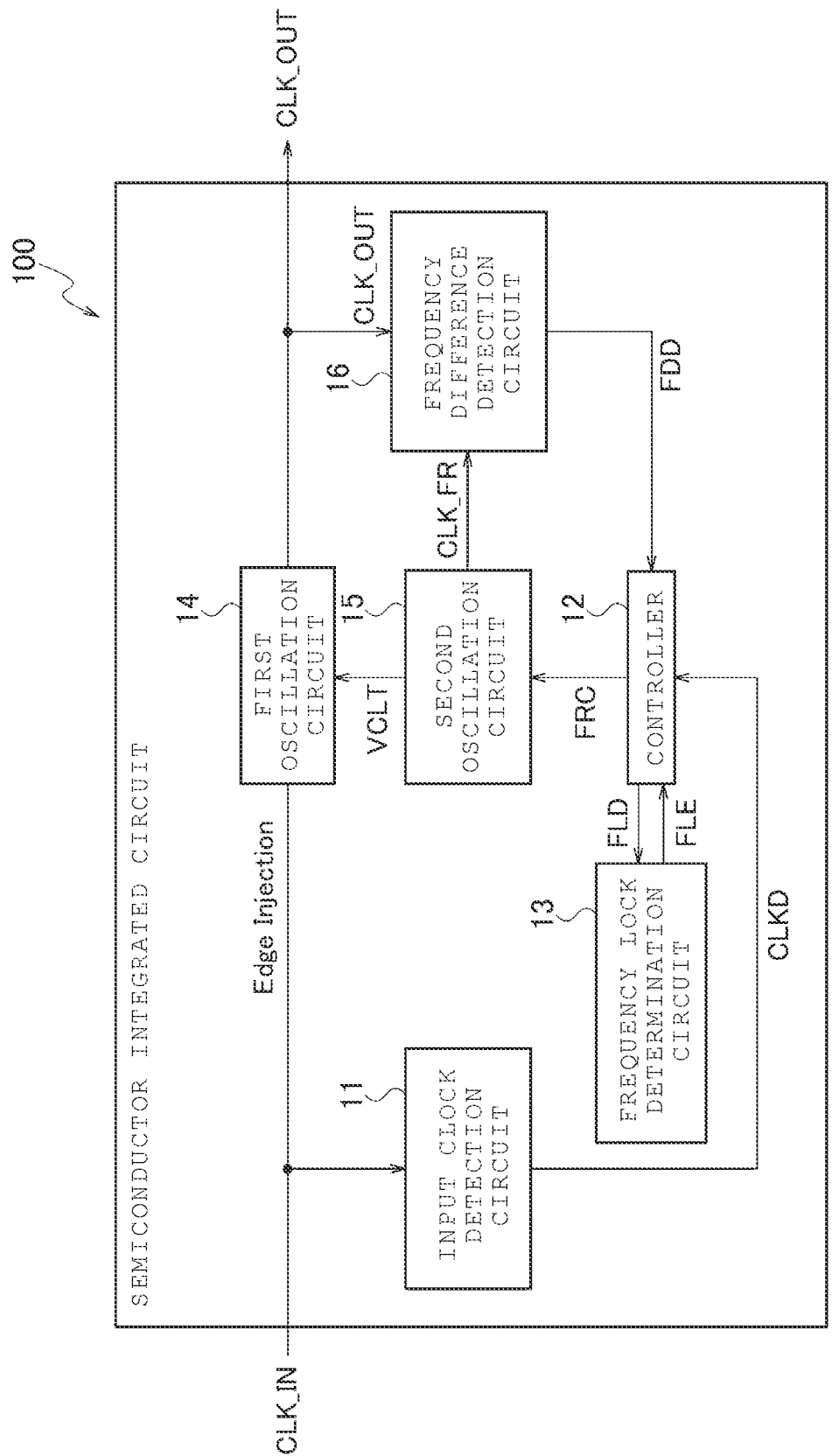
FIG. 1 is a block diagram illustrating a configuration of a semiconductor integrated circuit according to an embodiment.

Embodiments provide a semiconductor integrated circuit, a method of controlling a semiconductor integrated circuit, and a circuit system that achieve high-speed locking and low-jitter phase synchronization.

In general, according to an embodiment, a semiconductor integrated circuit includes a first oscillation circuit, a second oscillation circuit, a detection circuit, a determination circuit, and a control circuit. The first oscillation circuit is configured to receive a first clock signal and output a second clock signal synchronized with the first clock signal in frequency and phase. The second oscillation circuit is configured to receive a control signal and output a third clock signal having a frequency corresponding to the received control signal. The detection circuit is configured to detect a frequency difference between the second clock signal and the third clock signal. The determination circuit is configured to determine whether a frequency locked state is established between the first clock signal and the second clock signal. The control circuit is configured to vary the control signal, such that the frequency difference decreases while the frequency locked state has not been established and increases after the frequency locked state is established.

Embodiments will be described with reference to the drawings. In the description of the drawings described below, the same or similar elements are denoted by the same or similar reference numerals, and the description thereof is omitted. The drawings are schematic.

Further, the embodiments described below are examples of an apparatus and a method for embodying technical ideas, and do not specify the material, shape, structure, arrangement, and the like of each component. Various modifications may be made to the following embodiments within the scope of the claims.

Embodiments

Configuration of Semiconductor Integrated Circuit

As illustrated in FIG. 1, a semiconductor integrated circuit 100 according to an embodiment includes an input clock detection circuit 11, which is an example of a first detection circuit, a controller 12, which is an example of a control circuit, a frequency lock determination circuit 13, which is an example of a determination circuit, a first oscillation circuit 14, a second oscillation circuit 15, and a frequency difference detection circuit 16, which is an example of a second detection circuit.

A phase locked loop (hereinafter also referred to as PLL) circuit, for example, may be applied as the semiconductor integrated circuit 100. In the following description, a PLL circuit, which is an example of the semiconductor integrated circuit 100, will be described.

The input clock detection circuit 11 detects start and stop of input of an input clock signal CLK_IN, which is an example of a first clock signal. The input clock detection circuit 11 outputs a clock detection signal CLKD to the controller 12, for example, when detecting the start and stop of the input of the input clock signal CLK_IN. Here, the clock detection signal CLKD includes information indicating a state in which the input clock signal CLK_IN is input and a state in which the input clock signal CLK_IN is not input. The input clock signal CLK_IN is input to the input clock detection circuit 11 and the first oscillation circuit 14.

The controller 12 outputs a frequency control signal FRC to the second oscillation circuit 15 based on a result of determination by the frequency lock determination circuit 13, a result of detection by the input clock detection circuit 11, and a result of detection by the frequency difference detection circuit 16.

The controller 12 instructs the frequency lock determination circuit 13 to start and end counting. Specifically, the controller 12 outputs a determination start signal FLD to the frequency lock determination circuit 13, for example, based on information of the clock detection signal CLKD. Here, the determination start signal FLD is a signal including a command to start counting.

The controller 12 controls a frequency of a free-run clock signal CLK_FR. Specifically, the controller 12 outputs a frequency control signal FRC, which is an example of a control signal, to the second oscillation circuit 15 based on information of a frequency difference detection signal FDD, for example. Here, the information of the frequency difference detection signal FDD includes information of a frequency difference between an output clock signal CLK_OUT, which is an example of a second clock signal output by the first oscillation circuit 14, and the free-run clock signal CLK_FR, which is an example of a third clock signal output by the second oscillation circuit 15. In the following description, a frequency difference between the output clock signal CLK_OUT and the free-run clock signal CLK_FR is referred to as a frequency difference ΔF.

The controller 12 operates to change the frequency of the free-run clock signal CLK_FR, for example, based on the frequency difference ΔF. Specifically, the controller 12 outputs the frequency control signal FRC so that the frequency of the free-run clock signal CLK_FR approaches the frequency of the input clock signal CLK_IN in a first period until the frequency of the output clock signal CLK_OUT becomes the same as the frequency of the input clock signal CLK_IN. As a result, the frequency of the output clock signal CLK_OUT becomes the same as the frequency of the input clock signal CLK_IN during the first period. This state is also called a frequency locked state. That is, the frequency locked state is established during the first period. The frequency control signal FRC is a signal including a command for controlling the frequency of the free-run clock signal CLK_FR output by the second oscillation circuit 15.

Also, the controller 12 operates to change the frequency of the free-run clock signal CLK_FR so that the frequency difference ΔF increases during a second period following the first period. Specifically, the controller 12 outputs the frequency control signal FRC during the second period such that the frequency of the free-run clock signal CLK_FR is separated from the frequency of the input clock signal CLK_IN. The frequency locked state is maintained even when the frequency of the free-run clock signal CLK_FR is separated from the frequency of the input clock signal CLK_IN. As a result, the frequency of the output clock signal CLK_OUT is the same as the frequency of the input clock signal CLK_IN in the second period as well. That is, the frequency locked state continues in the second period as well. Here, the second period is a period after the start of input of the input clock signal CLK_IN and after the frequency of the output clock signal CLK_OUT becomes frequency-locked with the input clock signal CLK_IN.

The controller 12 operates to change the frequency of the free-run clock signal CLK_FR during a third period following the second period so that the frequency difference ΔF is close to zero. Specifically, the controller 12 outputs the frequency control signal FRC during the third period such that the frequency of the free-run clock signal CLK_FR approaches the frequency of the input clock signal CLK_IN. Here, the third period is a period after the input of the input clock signal CLK_IN is stopped.

The frequency lock determination circuit 13 determines whether the frequency of the output clock signal CLK_OUT is the same as the frequency of the input clock signal CLK_IN, that is, whether the frequency is locked. The frequency lock determination circuit 13 has a timer function. Specifically, for example, the frequency lock determination circuit 13 counts a predetermined period of time based on the information of the determination start signal FLD, and outputs a determination end signal FLE to the controller 12 after the predetermined period of time elapses. Here, the predetermined period of time is, for example, a period of time corresponding to the frequency or cycle of the input clock signal CLK_IN. Further, the determination end signal FLE is a signal including the determination result accompanying the end of the counting of the predetermined period of time.

The second oscillation circuit 15 receives the frequency control signal FRC from the controller 12. The second oscillation circuit 15 outputs the free-run clock signal CLK_FR having a certain frequency based on the frequency control signal FRC. Specifically, the second oscillation circuit 15 controls the frequency of the free-run clock signal CLK_FR based on the received frequency control signal FRC, and outputs the frequency-controlled free-run clock signal CLK_FR. The free-run clock signal CLK_FR output by the second oscillation circuit 15 is different from the input clock signal CLK_IN and the output clock signal CLK_OUT. Also, the frequency of the free-run clock signal CLK_FR corresponds to the frequency of the output clock signal CLK_OUT when the first oscillation circuit 14 is in a free-run state.

The second oscillation circuit 15 generates a control voltage VCLT based on the frequency control signal FRC and outputs the generated control voltage VCLT to the first oscillation circuit 14. Here, the control voltage VCLT is a voltage that is used to control the frequency of the output clock signal CLK_OUT output by the first oscillation circuit 14.

The first oscillation circuit 14 receives the input clock signal CLK_IN. The first oscillation circuit 14 outputs the output clock signal CLK_OUT synchronized with the input clock signal CLK_IN in phase and frequency. Specifically, the first oscillation circuit 14 synchronizes a rising edge and falling edge of the output clock signal CLK_OUT with a rising edge and/or falling edge of the input clock signal CLK_IN to synchronize the phase and frequency. Also, the first oscillation circuit 14 receives the control voltage VCLT from the second oscillation circuit 15. The first oscillation circuit 14 outputs the output clock signal CLK_OUT of which frequency is adjusted based on the control voltage VCLT when the input clock signal CLK_IN is not input. The first oscillation circuit 14 may apply a current for phase correction to the output clock signal CLK_OUT at the timing of the rising edge and/or the falling edge of the input clock signal CLK_IN, for example. Further, the first oscillation circuit 14 may be, for example, an injection lock type oscillation circuit.

The output clock signal CLK_OUT output by the first oscillation circuit 14 is output to the frequency difference detection circuit 16.

The frequency difference detection circuit 16 detects the frequency difference ΔF between the frequency of the output clock signal CLK_OUT and the frequency of the free-run clock signal CLK_FR. The frequency difference detection circuit 16 outputs the frequency difference detection signal FDD to the controller 12.

Next, a relationship between lock time and jitter propagation susceptibility with respect to the frequency difference ΔF will be described with reference to FIG. 2.

In FIG. 2, a curve L shows characteristics of lock time with respect to the frequency difference ΔF. A curve G shows characteristics of the jitter propagation susceptibility of the input clock signal CLK_IN with respect to the frequency difference ΔF. Here, jitter includes random jitter, deterministic jitter, periodic jitter, data dependent jitter, total jitter, and the like.

As illustrated by P0 on the curve L, the smaller the frequency difference ΔF, the less (that is, faster) the time to lock the frequency. As illustrated by P1 on the curve L, the greater the frequency difference ΔF, the longer (that is, slower) the time to lock the frequency. On the other hand, as illustrated by P2 on the curve G, the smaller the frequency difference ΔF, the larger (that is, it is easy to propagate) a value indicating the jitter propagation susceptibility of the input clock signal CLK_IN. As illustrated by P3 on the curve G, the larger the frequency difference ΔF, the smaller (that is, it is difficult to propagate) the value indicating the jitter propagation susceptibility of the input clock signal CLK_IN. Based on these characteristics, the semiconductor integrated circuit 100 performs operations described above. That is, the semiconductor integrated circuit 100 reduces the frequency difference ΔF in the first period in order to achieve high-speed locking until the frequency locked state is established. In the second period after the frequency locked state is established, the semiconductor integrated circuit 100 shifts the frequency of the free-run clock signal CLK_FR output from the second oscillation circuit 15, thereby making jitter in the input clock signal CLK_IN less likely to propagate.

Control Method

Next, a method of controlling the semiconductor integrated circuit 100 according to the embodiment will be described using a flowchart illustrated in FIG. 3 and a timing chart illustrated in FIG. 4. Waveforms illustrated in FIG. 4 are (a) input clock signal CLK_IN, (b) free-run clock signal CLK_FR, (c) frequency difference ΔF, and (d) output clock signal CLK_OUT. A time of t0 shown in FIG. 4 is the time when the start of input of the input clock signal CLK_IN is detected. For example, when the input clock signal CLK_IN starts to toggle in a state where the input clock signal CLK_IN continues to be at an L level, the start of input can be detected by detecting the rising edge of the input clock signal CLK_IN. A time of t1 is the time when a predetermined period of time elapsed since the frequency locked state was detected. A time of t2 is the time when the stop of the input of the input clock signal CLK_IN is detected. For example, the stop of the input can be detected by detecting a state where neither the rising edge nor the falling edge is present in the input clock signal CLK_IN from a state where the input clock signal CLK_IN is toggling.

The controller 12 sets the frequency of the free-run clock signal CLK_FR output by the second oscillation circuit 15 to a specific value during a period before t0 illustrated in FIG. 4. During the period before t0, the state is the same as a state after a process of S15, which will be described below. Specifically, the controller 12 outputs the frequency control signal FRC to the second oscillation circuit 15 so that the frequency of the free-run clock signal CLK_FR matches the frequency of the input clock signal CLK_IN.

In this state, as illustrated in FIG. 3, in S11, the input clock detection circuit 11 determines whether the start of the input clock signal CLK_IN is detected. When the start of the input clock signal CLK_IN is detected (YES in S11), the process proceeds to S12. Specifically, at t0 illustrated in FIG. 4, the input clock detection circuit 11 detects the start of the input clock signal CLK_IN and outputs the clock detection signal CLKD to the controller 12. When the start of the input clock signal CLK_IN is not detected (NO in S11), the process repeats S11. Specifically, in the period before t0 illustrated in FIG. 4, the input clock detection circuit 11 repeatedly detects the start of the input clock signal CLK_IN.

In S12, the first oscillation circuit 14 controls such that the output clock signal CLK_OUT is frequency-locked with respect to the input clock signal CLK_IN. Regarding the frequency locked state, specifically, at t0 shown in FIG. 4, the controller 12 instructs the frequency lock determination circuit 13 to start counting in response to the input of the clock detection signal CLKD. The frequency lock determination circuit 13 determines whether the frequency locked state is established after a certain time elapses. The certain time corresponds to the time required for the first oscillation circuit 14 to pull in the frequency in frequency lock control. After the certain time elapses, as a result of control by the first oscillation circuit 14, the frequency locked state is established. In response to this, the frequency lock determination circuit 13 determines that the frequency locked state is established, and outputs the determination end signal FLE to the controller 12. That is, the first oscillation circuit 14 operates so that the frequency of the output clock signal CLK_OUT is locked to the frequency of the input clock signal CLK_IN.

In S13, the controller 12 shifts the frequency of the free-run clock signal CLK_FR with respect to the frequency of the input clock signal CLK_IN. That is, the controller 12 changes the frequency of the free-run clock signal CLK_FR after the frequency locked state is established. Specifically, at t1 shown in FIG. 4, the controller 12 outputs the frequency control signal FRC to the second oscillation circuit 15 so as to change the frequency of the free-run clock signal CLK_FR with respect to the frequency of the input clock signal CLK_IN. The second oscillation circuit 15 outputs the free-run clock signal CLK_FR of which frequency is changed based on the frequency control signal FRC. The frequency difference detection circuit 16 detects the frequency difference ΔF between the output clock signal CLK_OUT and the free-run clock signal CLK_FR output by the second oscillation circuit 15. That is, during the period (second period) from t1 to t2 shown in FIG. 4, the frequency of the free-run clock signal CLK_FR is changed so that the frequency difference ΔF increases. That is, changing the frequency of the free-run clock signal CLK_FR increases the frequency difference ΔF. By increasing the frequency difference ΔF, the jitter of the input clock signal CLK_IN can be made less likely to be propagated to the output clock signal CLK_OUT. Here, the period (second period) from t1 to t2 is a period after the start of the input of the input clock signal CLK_IN and after the frequency of the output clock signal CLK_OUT becomes locked to the frequency of the input clock signal CLK_IN.

In S14, the input clock detection circuit 11 detects the stop of the input clock signal CLK_IN. Specifically, at t2 shown in FIG. 4, the input clock detection circuit 11 detects the stop of the input clock signal CLK_IN and outputs the clock detection signal CLKD to the controller 12.

In S15, the controller 12 sets the frequency of the free-run clock signal CLK_FR to a specific value. That is, the controller 12 operates to change the frequency of the free-run clock signal CLK_FR. Here, the specific value is a frequency near the frequency of the input clock signal CLK_IN. Specifically, the frequency difference detection circuit 16 detects the frequency difference ΔF between the output clock signal CLK_OUT and the free-run clock signal CLK_FR output by the second oscillation circuit 15. After t2 (third period) illustrated in FIG. 4, the controller 12 changes the frequency of the free-run clock signal CLK_FR so that the frequency difference ΔF approaches zero. That is, the controller 12 outputs the frequency control signal FRC to the second oscillation circuit 15 in response to the input of the clock detection signal CLKD, for example, so that the frequency of the free-run clock signal CLK_FR is set to the specific value. The second oscillation circuit 15 outputs the free-run clock signal CLK_FR of which frequency is changed based on the frequency control signal FRC. That is, in the period after t2 shown in FIG. 4, the frequencies of the output clock signal CLK_OUT and the free-run clock signal CLK_FR correspond to the specific value. Here, after t2 (third period) is a period after the input of the input clock signal CLK_IN is stopped.

Effect of Embodiment

As described above, according to the embodiment, the frequency of the free-run clock signal for achieving the frequency locked state is controlled. Specifically, the frequency difference is decreased for high-speed locking according to the input of the input clock signal, and then after the frequency locked state is established, the frequency of the free-run clock signal is shifted so that the jitter of the input clock signal is less likely to propagate. That is, according to the embodiment, it is possible to provide a semiconductor integrated circuit and a method of controlling the semiconductor integrated circuit that achieve high-speed locking and low jitter.

Circuit System

A configuration of a circuit system 1 including the semiconductor integrated circuit 100 according to the embodiment will be described.

Figure 5:
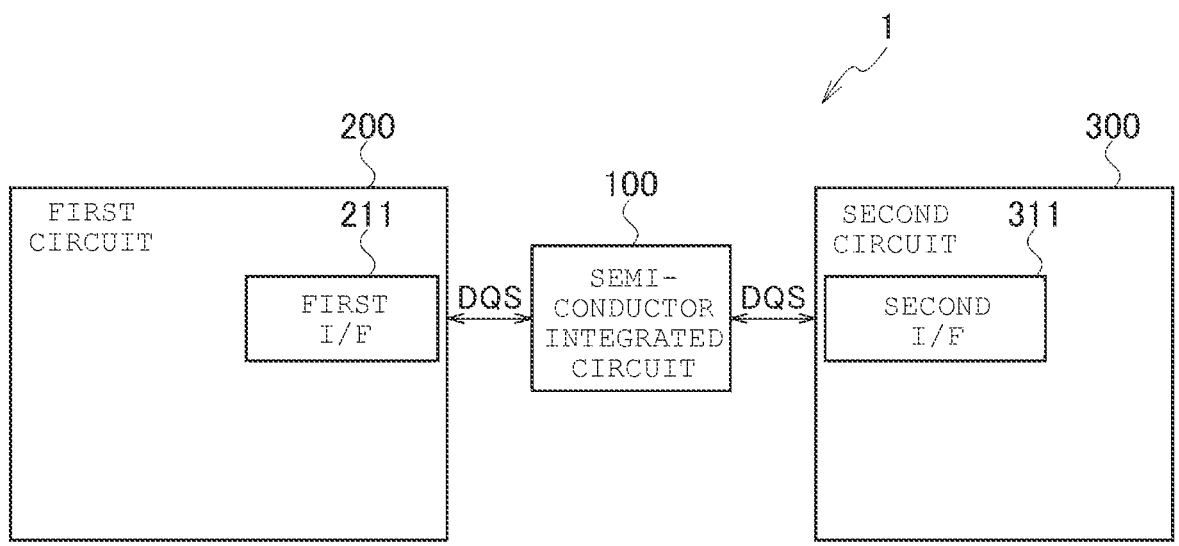
FIG. 5 is a diagram illustrating an example of a circuit system including the semiconductor integrated circuit according to the embodiment.

The circuit system 1 includes the semiconductor integrated circuit 100, a first circuit 200, and a second circuit 300, as illustrated in FIG. 5. That is, the semiconductor integrated circuit 100 described in the embodiment may be applied to the circuit system 1.

The semiconductor integrated circuit 100 communicates with the first circuit 200 and the second circuit 300. Specifically, the semiconductor integrated circuit 100 is electrically connected to the first circuit 200 and the second circuit 300 via a bus, for example, and relays communication between the first circuit 200 and the second circuit 300. The semiconductor integrated circuit 100 may process, for example, a data strobe signal (hereinafter referred to as DQS) as an example of the input clock signal CLK_IN and output a DQS signal as an example of the output clock signal CLK_OUT. Illustration and description of other signal lines are omitted.

The first circuit 200 has a first I/F 211. Specifically, the first circuit 200 may be, for example, a memory controller. The first I/F 211 is an example of a first interface circuit. The first I/F 211 is configured with an electronic circuit.

The first I/F 211 performs communication with the second circuit 300 via the semiconductor integrated circuit 100, for example. The first I/F 211 transmits and receives DQS signals, for example. The first I/F 211 may be, for example, a NAND interface. Although the DQS signal is given as an example of the signal to be transmitted and received, other signals may be used.

The second circuit 300 has a second I/F 311. Specifically, the second circuit 300 may be, for example, a non-volatile semiconductor memory such as a NAND flash memory. The second I/F 311 is an example of a second interface circuit. The second I/F 311 is configured with an electronic circuit.

The second I/F 311 performs communication with the first circuit 200 via the semiconductor integrated circuit 100, for example. The second I/F 311 transmits and receives DQS signals, for example. The second I/F 311 may be, for example, a signal control circuit that transmits and receives signals. Although the DQS signal is given as an example of the signal to be transmitted and received, other signals may be used.

In the following description, an interleave operation refers to an operation of bundling a plurality of configurations for performing certain processing and processing at several times the speed of the bundled configuration.

A configuration of a circuit system 1A including a semiconductor integrated circuit 100A according to the embodiment will be described.

Figure 6:
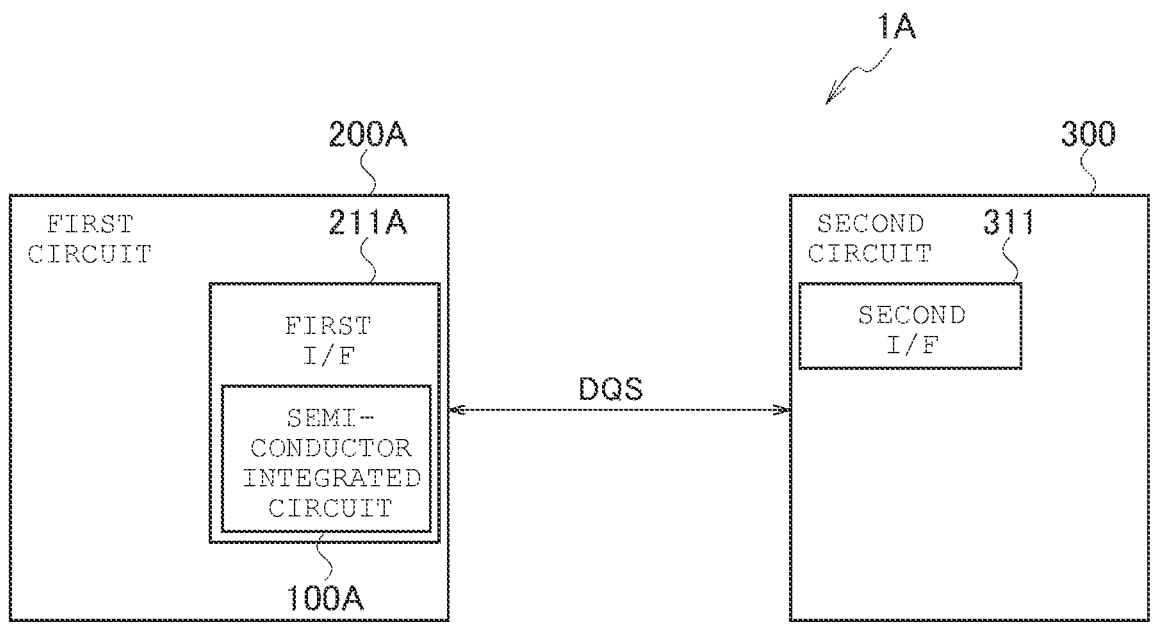
FIG. 6 is a diagram illustrating another example of the circuit system including the semiconductor integrated circuit according to the embodiment.

The circuit system 1A includes a first circuit 200A and a second circuit 300, as illustrated in FIG. 6. The first circuit 200A has a first I/F 211A. The circuit system 1A differs from the circuit system 1 illustrated in FIG. 5 in that the semiconductor integrated circuit 100A is provided in the first I/F 211A of the first circuit 200A. That is, the semiconductor integrated circuit 100A described in the embodiment may be applied to the circuit system 1A. The configuration of the second circuit 300 will be omitted to avoid redundancy.

Specifically, the first circuit 200A may be, for example, a memory controller. The first I/F 211A is another example of the first interface circuit. The first I/F 211A is configured with an electronic circuit.

The first I/F 211A includes the semiconductor integrated circuit 100A. The first I/F 211A performs communication with the second circuit 300 via the semiconductor integrated circuit 100A, for example. The first I/F 211A may be, for example, a NAND interface.

The semiconductor integrated circuit 100A receives and outputs, for example, a DQS signal. Specifically, the semiconductor integrated circuit 100A relays communication between the first circuit 200A and the second circuit 300. Although the DQS signal is given as an example of the signal to be transmitted and received, other signals may be used.

A configuration of a circuit system 1B including a semiconductor integrated circuit 100B according to the embodiment will be described.

Figure 7:
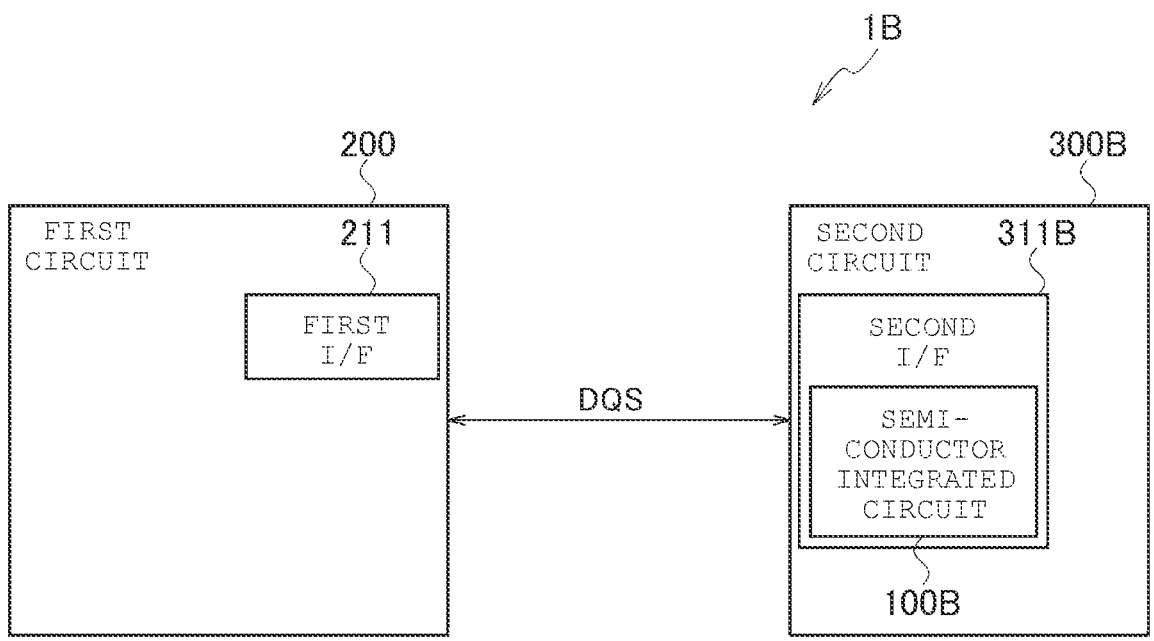
FIG. 7 is a diagram illustrating still another example of the circuit system including the semiconductor integrated circuit according to the embodiment.

The circuit system 1B, as illustrated in FIG. 7, includes a first circuit 200 and a second circuit 300B. The second circuit 300B includes a second I/F 311B. The circuit system 1B differs from the circuit system 1 shown in FIG. 5 in that the semiconductor integrated circuit 100B is provided in the second I/F 311B of the second circuit 300B. That is, the semiconductor integrated circuit 100B described in the embodiment may be applied to the circuit system 1B. The configuration of the first circuit 200 will be omitted to avoid redundancy.

Specifically, the second circuit 300B may be, for example, a non-volatile semiconductor memory such as a NAND flash memory. The second I/F 311B is another example of the second interface circuit. The second I/F 311B is configured with an electronic circuit.

The second I/F 311B includes the semiconductor integrated circuit 100B. The second I/F 311B performs communication with the first circuit 200 via, for example, the semiconductor integrated circuit 100B. The second I/F 311B may be, for example, a signal control circuit that transmits and receives signals.

The semiconductor integrated circuit 100B, for example, receives/outputs and transmits/receives a DQS signal. Specifically, the semiconductor integrated circuit 100B relays communication between the first circuit 200 and the second circuit 300B. Although the DQS signal is given as an example of the signal to be transmitted and received, other signals may be used.

Effect of Circuit System

As described above, by transmitting and receiving signals via the semiconductor integrated circuit according to the embodiment, for example, during interleave operation, it is possible to lock the frequency to the input clock signal at high speed and generate a clock signal with less jitter. That is, it is possible to provide a circuit system that achieves high-speed locking and low jitter.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
   a first oscillation circuit configured to receive a first clock signal and output a second clock signal synchronized with the first clock signal in frequency and phase;
   a second oscillation circuit configured to receive a control signal and output a third clock signal having a frequency corresponding to the received control signal;
   a detection circuit configured to detect a frequency difference between the second clock signal and the third clock signal;
   a determination circuit configured to determine whether a frequency locked state is established between the first clock signal and the second clock signal; and
   a control circuit configured to vary the control signal, such that the frequency difference decreases while the frequency locked state has not been established and increases after the frequency locked state is established.

2. The semiconductor integrated circuit according to claim 1, wherein the control circuit is configured to vary the control signal, such that the frequency difference increases and is maintained at a predetermined value after the frequency locked state is established.

3. The semiconductor integrated circuit according to claim 1, wherein the control circuit is configured to vary the control signal, such that the frequency difference decreases to zero while the frequency locked state has not been established.

4. The semiconductor integrated circuit according to claim 1, wherein the control circuit is configured to vary the control signal, such that the frequency difference again decreases when input of the first clock signal is stopped after the determination circuit determines that the frequency locked state is established.

5. The semiconductor integrated circuit according to claim 4, wherein the control circuit is configured to vary the control signal, such that the frequency difference decreases to zero when the input of the first clock signal is stopped after the determination circuit determines that the frequency locked state is established.

6. The semiconductor integrated circuit according to claim 1, wherein
   the second oscillation circuit is configured to output a control voltage to the first oscillation circuit, and
   the first oscillation circuit is configured to control the frequency of the second clock signal based on the control voltage when the first clock signal is not input.

7. The semiconductor integrated circuit according to claim 1, wherein the control circuit is configured to control the determination circuit to start an operation to determine whether the frequency locked state is established when input of the first clock signal is started.

8. The semiconductor integrated circuit according to claim 7, wherein the control circuit is configured to transmit a second control signal to the determination circuit to start the operation to determine whether the frequency locked state is established, and
the determination circuit is configured to perform the operation for a predetermined period of time after receiving the second control signal.

9. The semiconductor integrated circuit according to claim 1, wherein
   the first oscillation circuit is configured to receive the first clock signal from a first terminal connectable to a first external circuit, and
   the second oscillation circuit outputs the second clock signal to a second terminal connectable to a second external circuit.

10. A method of controlling a semiconductor integrated circuit including:
    a first oscillation circuit configured to receive a first clock signal and output a second clock signal synchronized with the first clock signal in frequency and phase;
    a second oscillation circuit configured to output a third clock signal having a frequency corresponding a control signal, the method comprising:
    determining whether a frequency locked state is established between the first clock signal and the second clock signal; and
    varying the control signal, such that a frequency difference between the second clock signal and the third clock signal decreases while the frequency locked state has not been established and increases after the frequency locked state is established.

11. The method according to claim 10, wherein the control signal is varied, such that the frequency difference increases and is maintained at a predetermined value after the frequency locked state is established.

12. The method according to claim 10, wherein the control signal is varied, such that the frequency difference decreases to zero while the frequency locked state has not been established.

13. The method according to claim 10, further comprising:
    detecting stop of input of the first lock signal after the frequency difference increases; and
    then varying the control signal, such that the frequency difference decreases.

14. The method according to claim 10, further comprising:
    detecting start of input of the first clock signal,
    wherein said determining is carried out when input of the first clock signal is started.

15. The method according to claim 14, wherein said determining is carried out during a predetermined period of time after the input of the first clock signal is started.

16. A circuit system comprising:
    a first circuit configured to generate a first clock signal;
    a semiconductor integrated circuit comprising:
      a first oscillation circuit configured to receive the first clock signal and output a second clock signal synchronized with the first clock signal in frequency and phase;
      a second oscillation circuit configured to receive a control signal and output a third clock signal having a frequency corresponding to the received control signal;
      a detection circuit configured to detect a frequency difference between the second clock signal and the third clock signal;

a determination circuit configured to determine whether a frequency locked state is established between the first clock signal and the second clock signal; and a control circuit configured to vary the control signal, such that the frequency difference decreases while the frequency locked state has not been established and increases after the frequency locked state is established; and a second circuit configured to receive the second clock signal from the semiconductor integrated circuit.

17. The circuit system according to claim 16, wherein the first circuit includes a first interface circuit, the second circuit includes a second interface circuit, and the semiconductor integrated circuit is connected between the first interface circuit and the second interface circuit.

18. The circuit system according to claim 16, wherein the first circuit includes a first interface circuit, the second circuit includes a second interface circuit connected to the first interface circuit, and the semiconductor integrated circuit is included in the first interface circuit.

19. The circuit system according to claim 16, wherein the first circuit includes a first interface circuit, the second circuit includes a second interface circuit connected to the first interface circuit, and the semiconductor integrated circuit is included in the second interface circuit.

20. The circuit system according to claim 16, wherein the first circuit is configured to transmit a data signal with the first clock signal to the second circuit via the semiconductor integrated circuit.

* * * * *